United States Patent [19]

Shida

[11] Patent Number: 5,104,829

[45] Date of Patent: Apr. 14, 1992

[54] METHOD OF MANUFACTURING SEMICONDUCTOR INTEGRATED CIRCUIT

[75] Inventor: Akira Shida, Tokyo, Japan

[73] Assignee: NEC Corporation, Japan

[21] Appl. No.: 627,758

[22] Filed: Dec. 14, 1990

[30] Foreign Application Priority Data

Dec. 20, 1989 [JP] Japan .................................. 1-332005

[51] Int. Cl.⁵ ......................................... H01L 21/02
[52] U.S. Cl. ................................. 437/235; 437/228; 437/31; 437/26; 437/34; 437/70; 437/956; 437/74; 437/77
[58] Field of Search .................. 437/228, 31, 26, 147, 437/235, 34, 51, 70, 956, 74, 77

[56] References Cited

U.S. PATENT DOCUMENTS

| | | | |
|---|---|---|---|
| 4,516,316 | 8/1985 | Haskell | 437/228 |
| 4,803,179 | 2/1989 | Neppl et al. | 437/70 |
| 4,931,406 | 6/1990 | Tomioka | 437/228 |
| 4,970,174 | 11/1990 | Min et al. | 437/31 |

*Primary Examiner*—Brian E. Hearn
*Assistant Examiner*—Trung Dang
*Attorney, Agent, or Firm*—Laff, Whitesel, Conte & Saret

[57] ABSTRACT

A semiconductor integrated circuit is manufactured in the following steps. A first silicon oxide film is formed on a silicon substrate. A silicon nitride film is formed on the first silicon oxide film. A second silicon oxide film is formed on the silicon nitride film. The second silicon oxide film is patterned by isotropic etching. The silicon nitride film is etched by using the patterned second silicon oxide film as a mask. A first region having one conductivity type is selectively formed in the silicon substrate by using the second silicon oxide film as a mask. An outer peripheral region of the second silicon oxide film is isotropically etched. The silicon nitride film is etched by using the second silicon oxide film, whose outer peripheral region is etched, as a mask. A third silicon oxide film is formed by a selective oxidation method using the remaining silicon nitride film as a mask. The silicon nitride film is removed. A second region having the other conductivity type is selectively formed in the silicon substrate by using the third silicon oxide film as a mask.

3 Claims, 5 Drawing Sheets

METHOD OF MANUFACTURING SEMICONDUCTOR INTEGRATED CIRCUIT

BACKGROUND OF THE INVENTION

The present invention relates to a method of manufacturing a semiconductor integrated circuit and, more particularly, to a method of manufacturing a Bi-CMOS integrated circuit.

In current Bi-CMOS integrated circuits, a structure having n+-/p+-type buried regions and n-/p-type wells is most widely used.

A conventional technique of forming n+-/p+-type buried regions in one mask formation step in order to decrease the number of mask formation steps will be described below with reference to FIGS. 2A to 2F.

As shown in FIG. 2A, a first silicon oxide film 2 and a silicon nitride film 3 are formed on a p-type silicon substrate 1.

As shown in FIG. 2B, the silicon nitride film 3 and the first silicon oxide film 2 are partially removed. Thereafter, n+-type regions 6a and 6b are selectively formed by solid-phase diffusion of arsenic.

As shown in FIG. 2C, a third silicon oxide film 7 is formed by selective oxidation using the silicon nitride film 3 as a mask.

As shown in FIG. 2D, after the silicon nitride film 3 and the first silicon oxide film 2 are removed, p+-type regions 8a and 8b are selectively formed by solid-phase diffusion of boron.

As shown in FIG. 2E, after the third silicon oxide film 7 is removed, an n-type layer 9 is epitaxially grown.

Subsequently, as shown in FIG. 2F, an n-type well region is formed on the n+-type region 6a. A p-channel MOS transistor $Q_1$ is formed in the n-type well region. A p-type well region is formed on the p+-type region 8a. An n-channel MOS transistor $Q_2$ is formed in the p-type well region. An npn transistor $Q_3$ is then formed on an n-type layer 9 in the n+-type region 6b.

In a Bi-CMOS integrated circuit using a p-type silicon substrate and an n-type epitaxial layer, the following requirements must be satisfied: a reduction in collector resistance of an npn transistor; connection between the p-type silicon substrate and a p-type well in which an n-channel MOS transistor is formed; and an increase in impurity concentration in the n+-type regions 6a and 6b and p+-type regions 8a and 8b.

When such a circuit is formed by the above-described conventional manufacturing method, the gap between an opening, used to form a diffusion source of an n+-type region, and an opening, used to form a diffusion source of a p+-type region, is as small as about the width of the third silicon oxide film formed under the silicon nitride film 3 during selective oxidation of silicon.

For this reason, as indicated by dotted lines in FIG. 2F, since the n+-type and p+-type regions directly overlap each other at their boundary regions, a decrease in reverse breakdown voltage between n+-type regions tend to occur in addition to an increase in capacitance. Therefore, an increase in operation speed of an npn transistor, achieved by increasing the impurity concentration of n+-type regions, has limitations. In addition, such a conventional technique cannot be suitably applied to a Bi-CMOS integrated circuit to be operated with a high power source voltage.

SUMMARY OF THE INVENTION

It is an object of the present invention to provide method of manufacturing semiconductor integrated cicuit, which can suppress or control a decrease in reverse breakdown voltage or an increase in capacitance between first and second regions, which tend to occur with an increase in impurity concentration of the first or second region.

In order to achieve the above object, according to the present invention, there is provided a method of manufacturing a semiconductor integrated circuit, comprising the steps of forming a first silicon oxide film on a silicon substrate, forming a silicon nitride film on the first silicon oxide film, forming a second silicon oxide film on the silicon nitride film, patterning the second oxide film by isotropic etching, etching the silicon nitride film by using the patterned second silicon oxide film as a mask, selectively forming a first region having one conductivity type in the silicon substrate by using the second silicon oxide film as a mask, isotropically etching an outer peripheral region of the second silicon oxide film, etching the silicon nitride film by using the second silicon oxide film, whose outer peripheral region is etched, as a mask, forming a third silicon oxide film by a selective oxidation method using the remaining silicon nitride film as a mask, removing the silicon nitride film, and selectively forming a second region having the other conductivity type in the silicon substrate by using the third silicon oxide film as a mask.

DESCRIPTION OF THE PREFERRED EMBODIMENT

An embodiment of the present invention will be described below with reference to the accompanying drawings.

Figure 1A:
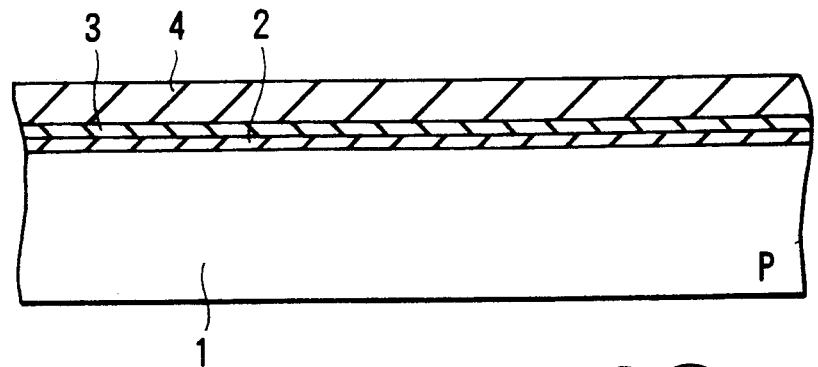
FIGS. 1A to 1I are sectional views, showing a sequence of the steps, for explaining an embodiment of the present invention.
Figure 1B:
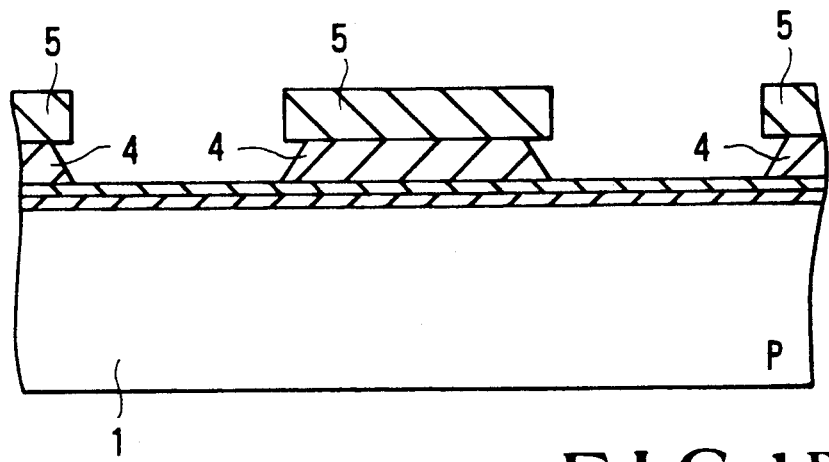

FIGS. 1A to 1B show a sequence of the steps according to an embodiment of the present invention.

As shown in FIG. 1A, a first silicon oxide film 2 is formed on a p-type silicon substrate 1 having an impurity concentration of $1 \times 10^{15}$ cm$^{-3}$ by thermal oxidation so as to have a thickness of about 30 nm. Thereafter, a silicon nitride film 3 having a thickness of about 0.2 μm and a second silicon oxide film 4 having a thickness of about 2 μm are grown on the resultant structure by the CVD method.

As shown in FIG. 1B, the second silicon oxide film 4 is etched isotropically by using a solution mixture of hydrogen fluoride and ammonium fluoride with a patterned photoresist 5 used as a mask.

Figure 1C:
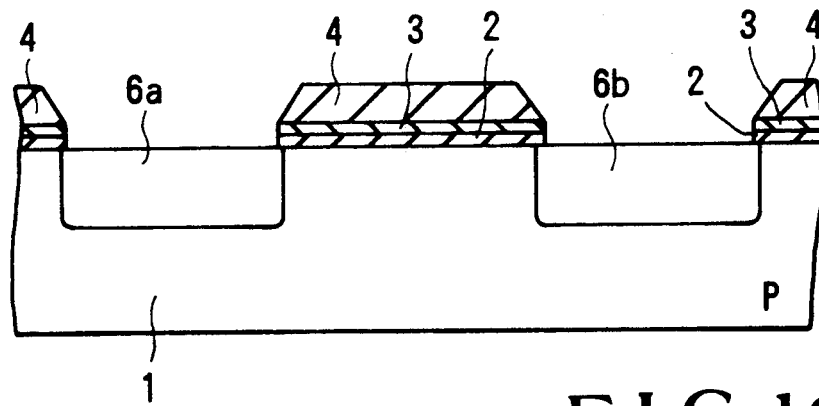

As shown in FIG. 1C, after the silicon nitride film 3 and the first silicon oxide film 2 are etched by using hot phosphoric acid and hydrogen fluoride, respectively, the photoresist 5 is removed. Thereafter, solid-phase diffusion of arsenic is performed. At this time, the second silicon oxide film 4 serves as a mask for diffusion. After this process, n+-type regions 6a and 6b each having a sheet resistance of about 20 Ω☐ by thermal diffusion at 1,100° to 1,200° C.

Figure 1D:
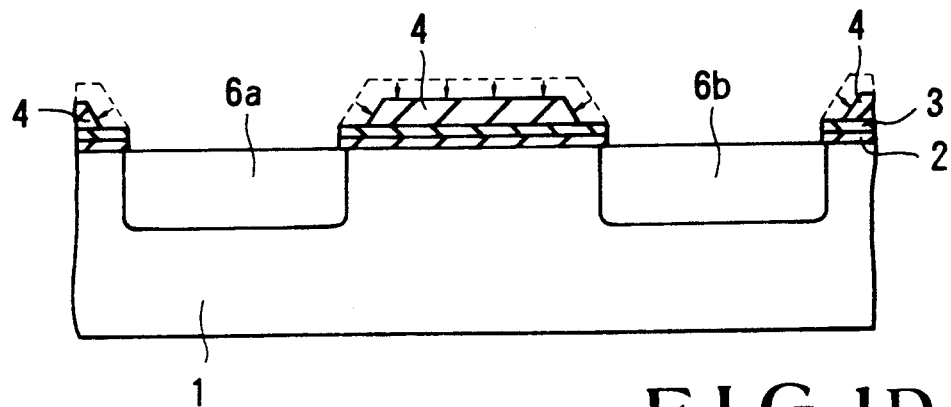

As shown in FIG. 1D, an outer peripheral region of the second silicon oxide film 4 is removed by an isotropic etching method using a solution mixture of hydrogen fluoride and ammonium fluoride.

Figure 1E:
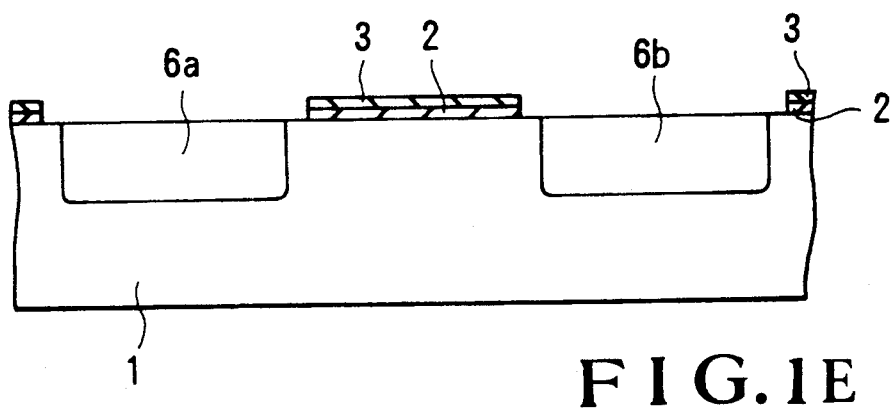

As shown in FIG. 1E, the silicon nitride film 3 is etched by using hot phosphoric acid with the second silicon oxide film 4, from which the outer peripheral region is removed, used as a mask.

Figure 1F:
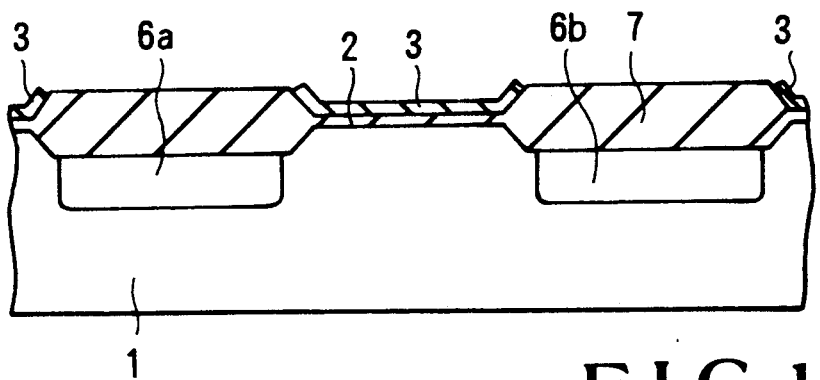

As shown in FIG. 1F, a third silicon oxide film 7 having a thickness of about 0.3 μm is formed by a nitride film 3 as a mask.

Figure 1G:
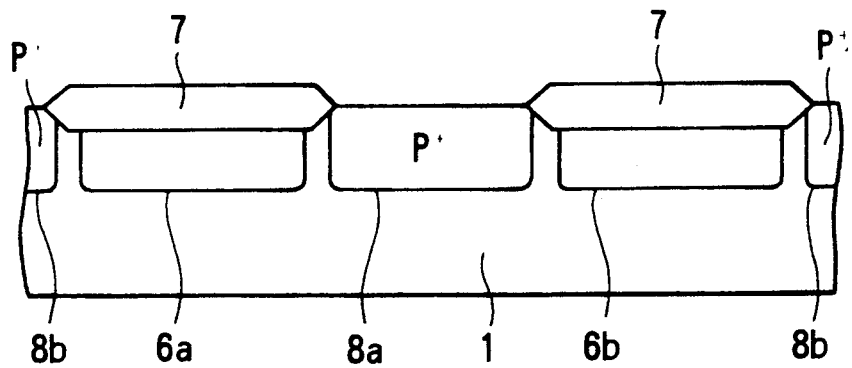

As shown in FIG. 1G, the silicon nitride film 3 and the first silicon oxide film 2 are removed. Solid-phase diffusion of boron is performed by using the third silicon oxide film 7 as a mask. Subsequently, thermal diffusion is performed at 1,000 to 1,100° C. With this process, $p^+$-type regions 8a and 8b each having a sheet resistance of about 150 Ω□ are selectively formed.

Figure 1H:
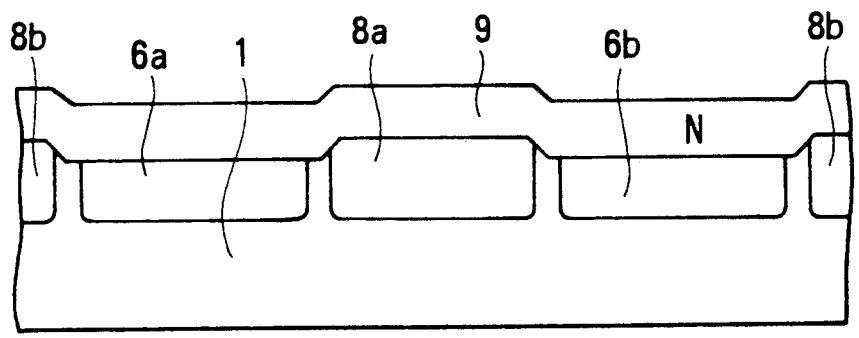

As shown in FIG. 1H, after the third silicon oxide film 7 on the silicon surface is removed, an n-type layer 9 is grown to have a thickness of 3 to 5 μm by the epitaxial growth method.

Figure 1I:
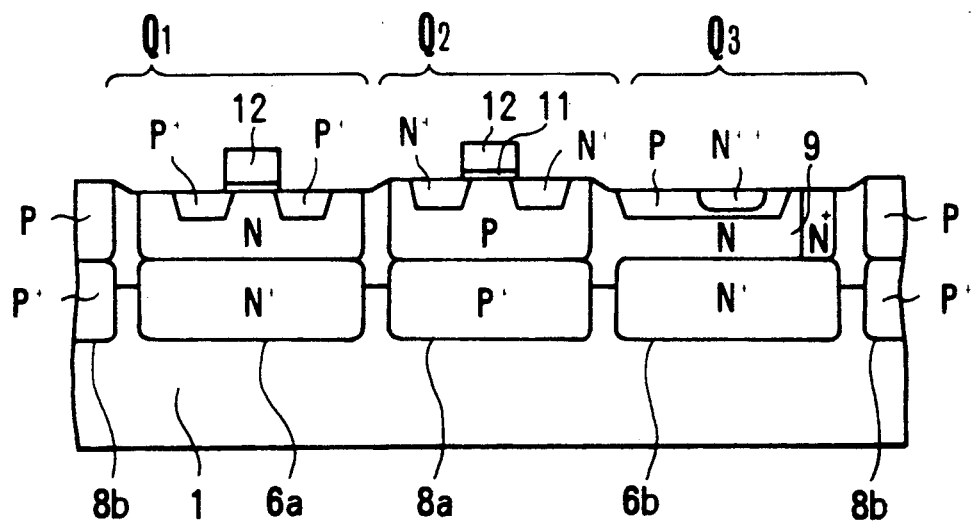
Figure 2A:
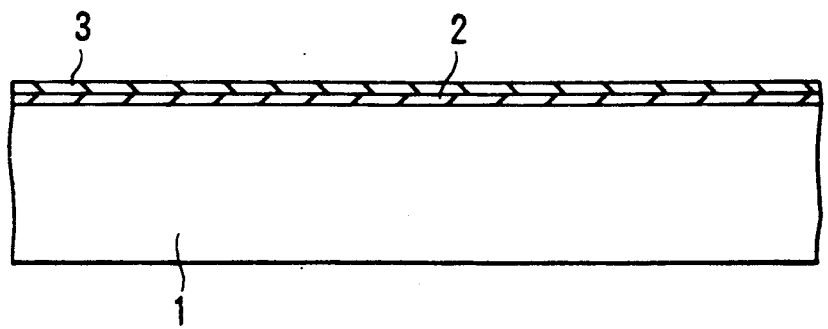
FIGS. 2A to 2F are sectional views, showing a sequence of the steps, for explaining a conventional method of manufacturing a Bi-CMOS integrated circuit.
Figure 2B:
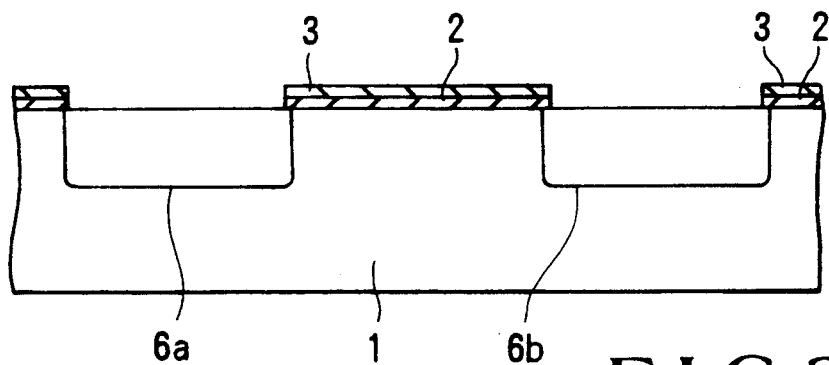
Figure 2C:
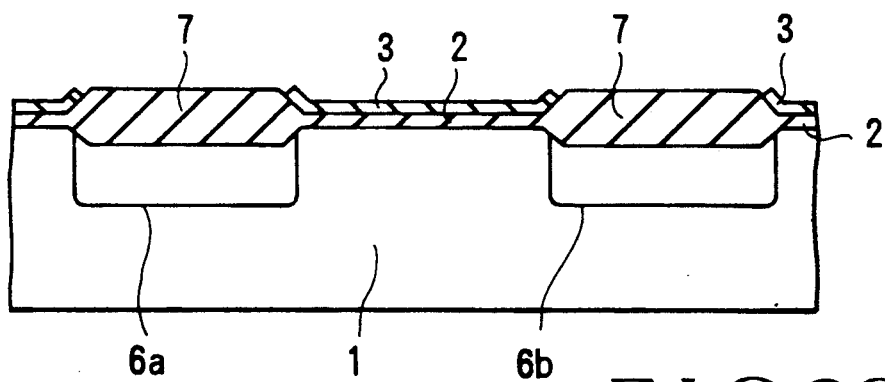
Figure 2D:
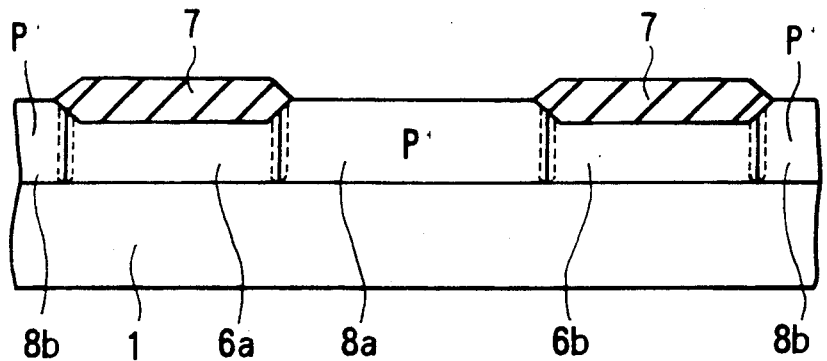
Figure 2E:
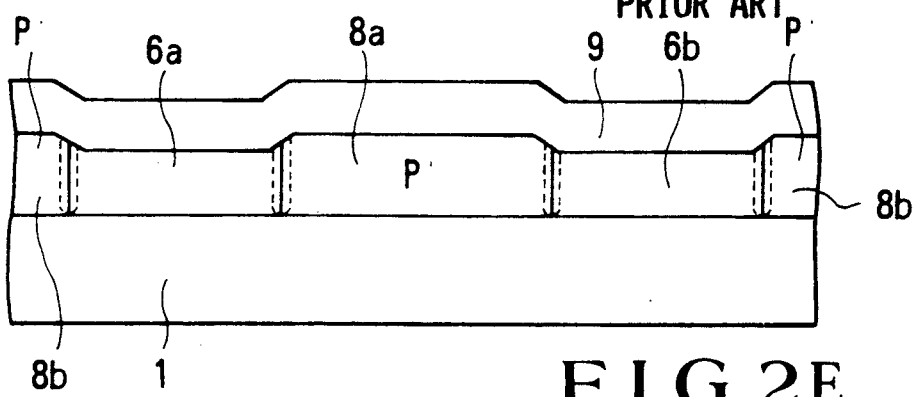
Figure 2F:
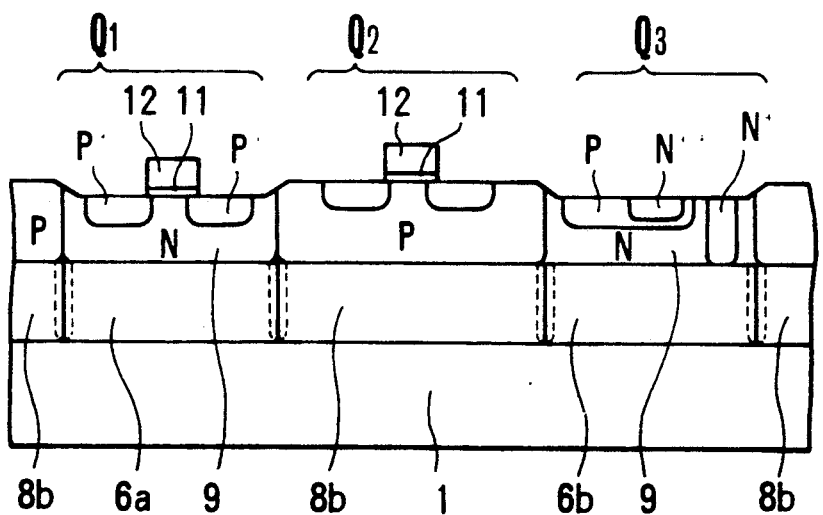

Subsequently, as shown in FIG. 1I, a p-channel MOS transistor $Q_1$ is formed on an n-type well region on the $n^-$-type region 6a; an n-channel MOS transistor $Q_2$, on an p-type well region on the $p^+$-type region 8a; and an npn transistor $Q_3$, on the n-type layer 9 on the $n^+$-type region 6b.

As has been described above, according to the manufacturing method of the present invention wherein first and second regions having opposite conductivity types are formed on a silicon substrate in one mask formation step, the width of an overlapping portion of the first and second regions can be controllably decreased by an amount corresponding to the width of an isotropically etched outer peripheral portion of a second silicon oxide film, unlike the conventional manufacturing method. Therefore, a decrease in reverse breakdown voltage or an increase in capacitance between the first and second regions, which tend to occur with an increase in impurity concentration of the first or second regions, can be suppressed or controlled.

What is claimed is:

1. A method of manufacturing a semiconductor integrated circuit, comprising the steps of:
    forming a first silicon oxide film on a silicon substrate;
    forming a silicon nitride film on said first silicon oxide film;
    forming a second silicon oxide film on said silicon nitride film;
    patterning said second silicon oxide film by isotropic etching;
    etching said silicon nitride film by using said patterned second silicon oxide film as a mask;
    selectively forming a first region having one conductivity type in said silicon substrate by using said second silicon oxide film as a mask;
    isotropically etching an outer peripheral region of said second silicon oxide film;
    etching said silicon nitride film by using said second silicon oxide film, whose outer peripheral region is etched, as a mask;
    forming a third silicon oxide film by a selective oxidation method using said remaining silicon nitride film as a mask;
    removing said silicon nitride film; and
    selectively forming a second region having the other conductivity type in said silicon substrate by using said third silicon oxide film as a mask.

2. A method according to claim 1, wherein said second silicon oxide film is thicker than said first silicon oxide film.

3. A method according to claim 1, wherein said second silicon oxide film is patterned by an isotropic etching method using a solution mixture of hydrogen fluoride and ammonium fluoride.

* * * * *